Figure 1:
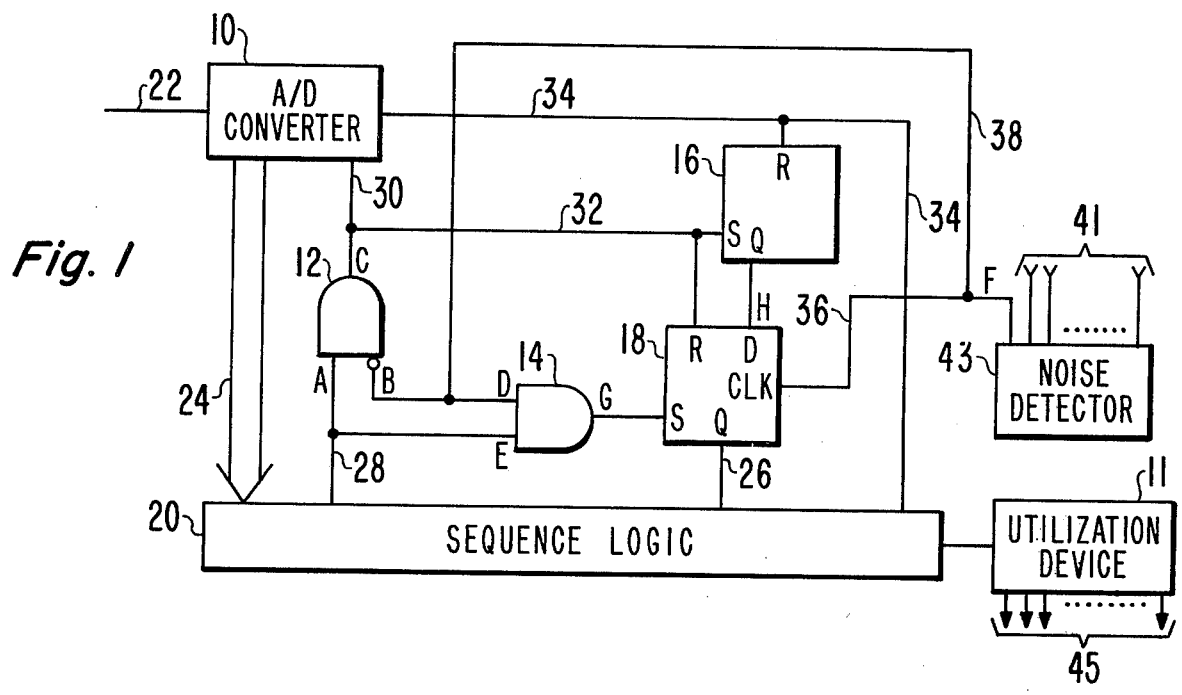

United States Patent [19]

Robbi

[11] 4,143,329
[45] Mar. 6, 1979

[54] SIGNAL SAMPLING CIRCUIT

[75] Inventor: Anthony D. Robbi, E. Amwell Township, Hunterdon County, N.J.

[73] Assignee: RCA Corporation, New York, N.Y.

[21] Appl. No.: 805,141

[22] Filed: Jun. 9, 1977

[30] Foreign Application Priority Data

Jun. 15, 1976 [GB] United Kingdom ............... 24720/76

[51] Int. Cl.² ............................................. H03K 17/16
[52] U.S. Cl. .................................... 328/163; 328/110; 328/165
[58] Field of Search ................ 328/163, 162, 165, 110

[56] References Cited

U.S. PATENT DOCUMENTS 3,310,751  3/1967  Atzebeck ............................. 328/163
4,063,183  12/1977  Evans ................................... 328/163

Primary Examiner—John S. Heyman
Attorney, Agent, or Firm—H. Christoffersen; A. L. Limberg; L. P. Benjamin

[57] ABSTRACT

A signal sampling circuit is disclosed which accommodates itself to operation during the presence of high noise levels encountered, for example, when attempting to monitor and control, and thus optimize, the functioning of an internal combustion engine. Noise detection means is provided for detecting the presence or absence of noise pulses during either a request for a signal sample or during a signal sampling period. When the noise detector indicates the presence of noise during the request or during the sampling period, the derived information is disregarded and either reread during the next, noise-free period or is resampled shortly after the sampling interval in which the discarded information was obtained.

9 Claims, 4 Drawing Figures

SIGNAL SAMPLING CIRCUIT

This invention relates to signal sampling circuits and, more particularly, to sampling circuits capable of operating despite the presence of high electrical noise levels.

In an endeavor to ensure the complete combustion in an internal combustion engine, and thus meet the clean-emission standards set by the Federal Environmental Protection Agency for the automotive industry, various schemes have been proposed and tried. The initial attempt to meet the standards employed exhaust gas recirculation and catalytic converters. However, due to certain inherent shortcomings, these systems were hard pressed to meet and maintain the minimum standards and are presently being replaced in favor of electronic devices that are capable of adaptably controlling the sparking function in the engine. These electronic devices, using semiconductor logic or microprocessors, when used in conjunction with standard automotive ignition systems, are capable, for example, of advancing or retarding the spark applied to the cylinders and thus achieve more optimum combustion.

The most obvious advantages of electronic control in an internal combustion engine reside in the fact that one is able to achieve more efficient fuel management, thus saving fuel, while the advantage of a more optimum combustion is the reduction of the pollutants, carbon monoxide, hydrocarbons and nitrous oxides. If the pollutants are sufficiently reduced the catalytic converter may be eliminated, obviating the need for heat shields as well as the high capacity cooling systems and the air pumps often used to supply the catalytic converter with oxygen. This represents a significant reduction in both the weight as well as the cost of the vehicle.

To adequately regulate the spark of a modern automobile internal combustion engine, the electronics should be capable of instantaneously monitoring at least the throttle position, any rate of change in the throttle position, the temperature of the intake air, coolant temperature, as well as engine timing, speed and the load or manifold vacuum. The present state of the semiconductor art allows for the periodic sampling of each of the necessary above-mentioned parameters. However, when investigating the transducers for converting the various engine parameters to a usable system input, one finds that there are two classes of system inputs, namely, the analog sensor input and a frequency or time reference input. The sensors, attached to the device whose parameter is to be measured may be either a switch, a thermistor, a variable inductance or variable capacitance as well as a Hall-Effect device or any other transducer capable of providing an analog input, that may be subsequently converted to some digital form, for signal processing. These analog inputs traditionally have low signal levels and, therefore, are easily contaminated by noise. If that noise is both unpredictable and externally generated, it can be dealt with and eliminated either by filtering, correlation techniques or some other means.

In many instances, however, the noise may be "system-generated" or "self-induced" in that the noise source may be a device controlled by the system output itself. Examples of this are the firing of an SCR, the opening or closing of an ignition coil circuit, the opening or closing of a relay, the turning on of a transmitter or even the firing of a spark plug through an unshielded or poorly shielded ignition wire.

It is often uneconomical to attempt to suppress this noise where it is generated; this tends to be particularly so in an automobile. Such system-generated noise is particularly troublesome if it occurs randomly with respect to the regularly recurring sampling intervals during which the sensor input is sampled, or polled. This is because, supposing the sampling intervals to have invariant periodicity as in the prior art, one cannot simply delay the sampling intervals with respect to the occurrence of noise, or vice-versa, to be assured that the sampling intervals occur at times that one may be reasonably confident that system-generated noise does not occur.

The present invention is embodied in sampling circuits which accommodate themselves to operation in systems subject to system-generated noise problems. Noise detection means are provided for detecting whether system-generated noise is present or absent. So long as the noise detection means indicate system-generated noise is absent, the information obtained during the regularly recurring sampling intervals is passed along to the ensuing portions of the system. When the noise detection means indicates system-generated noise is present during a sampling or A/D conversion interval, the information obtained during the interval is discarded, rather than being passed along to the ensuring portions of the system. The signal to be sampled is then deferred until the next cycle or resampled shortly after the sampling interval in which the discarded information was obtained, with the aim of obtaining a sample of signal uncontaminated by noise.

Figure 2:
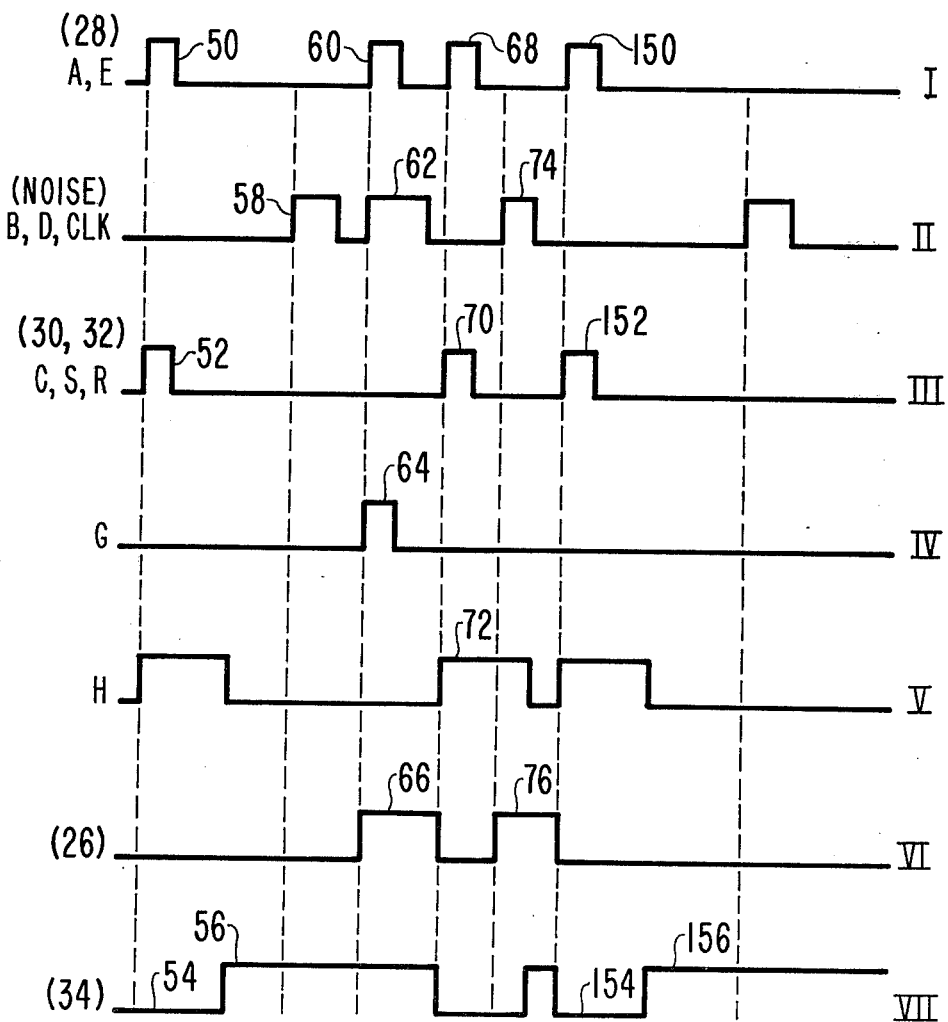
Figure 3:
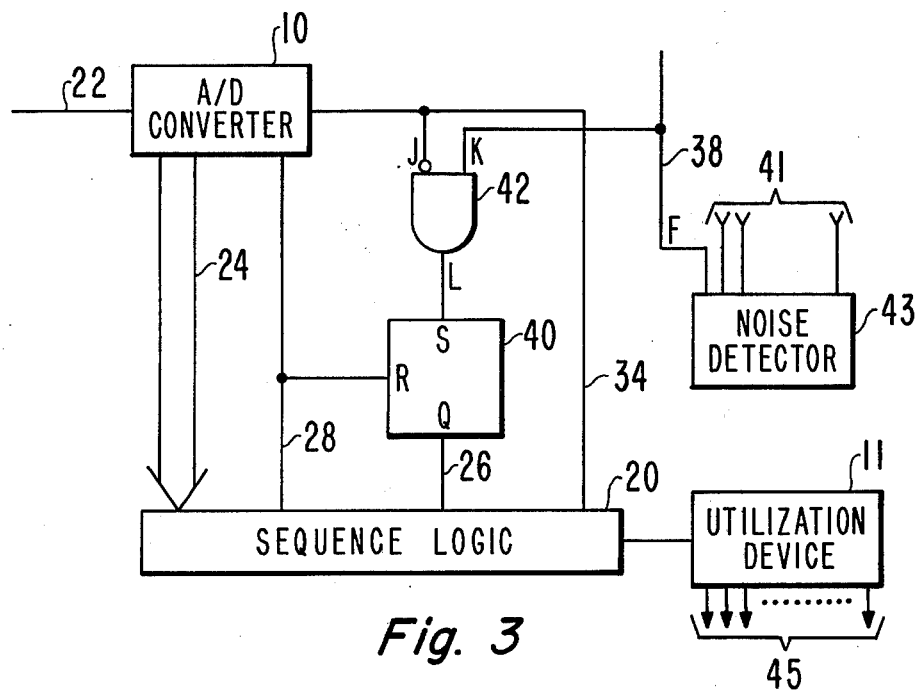
Figure 4:
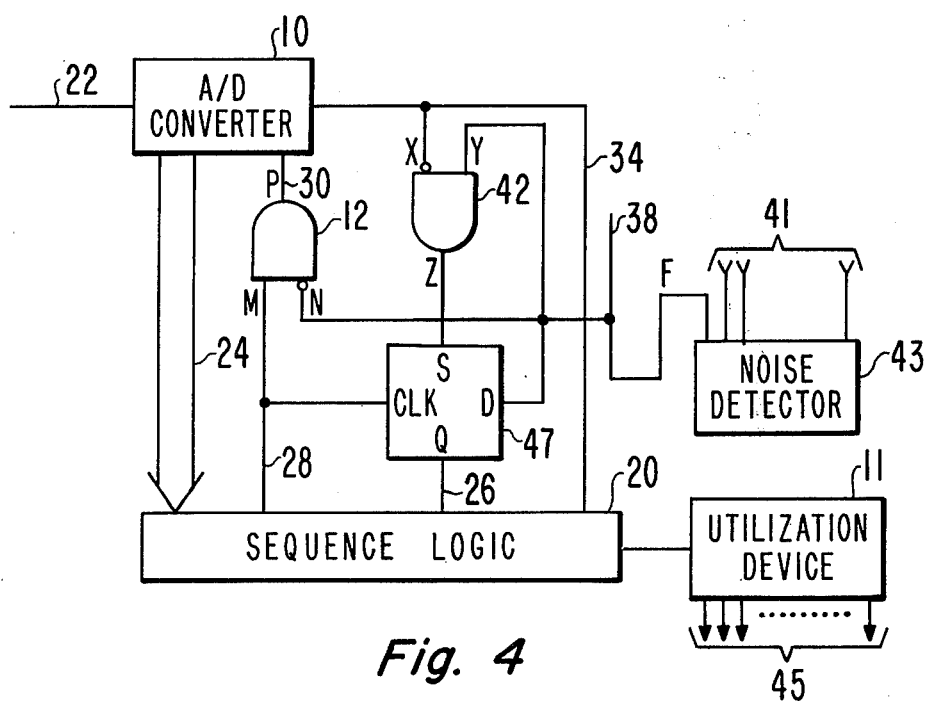

In the Drawing:

Each of FIGS. 1, 3 and 4 is a block schematic diagram of one embodiment of the invention; and FIG. 2 is a timing diagram which, when taken in conjunction with FIG. 1, further characterizes the invention.

In FIG. 1, the signal sampling circuit is comprised within an analog-to-digital (A/D) signal converter 10, with the sampling interval, during which an analog signal applied on line 22 is to be sampled, being initiated in response to a start pulse applied via line 30. A digital signal representing the level of the analog signal during the sampling interval is applied via bus 24 to sequence logic 20. Bus 24 may comprise a single connection through which the digital information is transmitted in serial-bit form or, alternatively, a number of parallel connections through which the digital information is transmitted in parallel-bit form.

Sequence logic 20 may be provided by a microprogrammable controlled or a microprocessor (such as the RCA CDP 1802) under program control, generates request pulses supplied via line 28 on regularly recurring intervals corresponding to the desired sampling intervals for A/D converter 10 or whenever a re-read signal is applied thereto via line 26. After a predetermined interval from each of the regularly recurring request pulses, sequence logic 20 will pass the information it has received via bus means 24 to utilization device 11. Converted information is admitted into sequence logic 20 via bus 24 and when the sampling interval is completed, A/D converter transmits a data read signal, via line 34, to sequence logic module 20. If a re-read signal has not been received on line 26 pertaining to the occurrence of noise during the sampling interval in which that information was generated, response to that information is imparted to a utilization device 11.

Logic gates 12, 14 are standard elements. Flip-flops 16, 18 are also standard elements. It should be here noted that flip-flops 16 (FIG. 1) and 40 (FIG. 3), may be implemented by non-clocked, set-reset type devices such as the RCA 4013 flip-flop without the data input or latching clock facilities or by suitable cross-coupled gates. Similarly, flip-flops 18 (FIG. 1) and flip-flop 41 (FIG. 4) may be implemented by clocked, set-reset devices having "data" and "clock" inputs such as an RCA 4013 flip-flop.

Noise detection means 43 detects the presence of noise that can be expected to contaminate the signal to be sampled and appearing on line 22. These noise pulses, derived from other utilization devices (not shown) are transmitted to noise detector 43, via lines 41, while the noise pulses generated by utilization device 11 is transmitted to other noise detectors (not shown) via lines 45 to be utilized in the appropriate noise detectors associated with the sampling of other parameters. When noise is present, a "high" signal level is applied at point F, which, at all other times is at a "low" signal level. Where system-generated noise is caused by the turning on and turning off of other utilization devices (not shown) in near-by electrical circuitry (not shown), responsive to binary digital control signals, the noise detection means 43 may simply constitute a connection of these digital control signals to point F if the digital control signals are of correct sense; or otherwise, a simple inverter may be used. The noise detection feedback means may also include means for sensing high-level electromagnetic radiation from noise sources outside the system which are likely to be coupled to line 22.

Referring now to FIG. 2 in conjunction with FIG. 1, it will be seen that operation begins when sequence logic module 20 initiates a request pulse 50 on line 28 (waveform I FIG. 2) to start the sampling intervals during which analog information on line 22 will be sampled for A/D conversion. In the absence of any noisy output (F) pulses on line 38, input "B" (gate 12) is "low" and gate 12 responds by applying a start pulse 52 to A/D converter 10 via line 30. A/D converter 10 responds by beginning an A/D conversion cycle 54 of any analog input signal 22 applied to converter 10. The output of A/D converter 10 appears on bus 24 and is applied to logic module 20. At the completion of the A/D conversion cycle, A/D converter 10 provides a "high" data ready output signal 56 on line 34 to be applied to sequence logic module 20 which responds by accepting the data provided on bus 24 from the A/D converter 10. Provided that "high" reread signal has not been caused to appear on line 26 because of noisy output signals F having occurred between the initiation of start pulse 52 and the end of the time required by the A/D converter 10 to perform an A/D conversion, the sequence logic 20 passes on to a utilization device 11 the data it has received via bus 24. Utilization device 11, for example, may be a device used to retard or advance the sparking of an ignition.

The occurrence of noise pulse 58 before the occurrence of the next request pulse 60 has no effect on the system. Gate 12 requires a "low" input at its input terminal "B" and a "high" input at its input terminal "A" to provide a "high" start pulse at "C" to line 30, and its input terminal "A" is "low" absent a request pulse.

Assuming now the situation where a "high" noise pulse 62 occurs simultaneously with the occurrence of request pulse 60, it will be seen that input "B" of gate 12, input D of gate 14, as well as the clock input of flip-flop 18 all go high. Since request pulse 60 has already been initiated and now appears on line 28, input "A" of gate 12 and input "E" of gate 14 are also "high". The net result is that gate 12 is now inhibited and no start pulse appears on line 30 for application to A/D converter 10. Since input "D" and input "E" of gate 14 are both "high", an output signal 64 appears at output terminal "G" to set flip-flop 18. The presence of a "high" signal at terminal "S" produces a "high" reread signal 66 on line 26 which, when applied to sequence logic module 20, indicates that the data supplied via bus 24 is invalid and causes another request pulse 68 to be subsequently initiated by sequence logic 20. Since no noise occurs during the request pulse 68, the A/D converter 10 begins a new conversion cycle. A start pulse appears on line 30 due to the absence of any input at terminal "B" of gate 12 as previously described. However, this "high" start pulse 70 is applied via line 32 to terminal "S" of flip-flop 16 to set it and to terminal "R" of flip-flop 18 to reset it. The setting of flip-flop 16 produces a data signal 72 at the output of flip-flop 16. In the absence of any noise appearing on "clock" input of flip-flop 18, the output of flip-flop 18 (line 26) remains "low" indicating valid data.

Suppose, however, the noise pulse 74 appears after the onset of a request pulse and during the conversion process, as shown. Gates 12 and 14 will be unaffected. But, since a "high" signal appears at the data input of flip-flop 18 concurrently with the presence of noise signal 74, flip-flop 18 produces a "high" signal 76, at output "Q", to be applied via line 26 to sequence logic module 20 indicating that the data may be invalid and should be disregarded. Yet another conversion cycle would then be initiated by the issuance of another request pulse 150 followed by pulses 152, 154 and 156. Thereafter, in the absence of noise pulses a conversion cycle would proceed to completion as previously described with regard to pulse 50, 52, 54 and 56.

In summary, it will be seen that if a noisy output pulse "F" occurs after an A/D conversion cycle is completed, indicated by the signal on data ready line 34 going "high", the reread signal appearing on line 26 remains "low". However, if the noisy output signal "F" is "high" during the initiation of the request pulse on line 28, gate 12 will be inhibited from providing a start pulse on line 30. At the same time, gate 14, in response to the concurrent A/D signal and noisy output pulses, will apply a "high" signal to input "S" of flip-flop 18 to set this flip-flop which will then respond by providing a "high" reread signal on line 26 to sequence logic module 20 indicating an invalid reading. In response to the "high" reread signal on line 26, sequence logic module 20 will provide another request pulse, such as 68, after a given period of time. If the noisy output signal has gone "low" at this time, gate 12 will respond with a "high" start pulse on line 30. In response to the start A/D pulse, flip-flop 18 will be set causing the reread signal on line 26 to be "low" and flip-flop 16 will be set, causing the signal at "H" to go high. A/D converter 10 will then begin a new conversion cycle. If a noisy output pulse occurs during this conversion cycle, flip-flop 18 will respond by providing a "high" reread signal on line 26 and, sequence logic module 20, on sensing a "high" data ready signal on line 34, concurrent with a high reread signal on line 26, will respond by rejecting data from A/D converter 10 and will once again initiate a request to repeat the sampling of the analog signal appearing at the input of A/D converter 10. If the noisy output signal is "low" during the time of the occurrence of a request pulse on line 28 a "high" start pulse will appear on line 30. In response to the start pulse on line 30, the A/D converter 10 will begin a new conversion of any analog input information appearing on line 22 to the input to A/D converter 10. At the same time, flip-flop 16 will be set by the start pulse on line 32 causing the signal on "H" to go "high" while flip-flop 18 will be reset causing the reread signal on line 26 to go "low". If no noisy output pulse occurs during the conversion time of A/D converter 10, at the end of this time, the A/D converter 10 will present a "high" data ready signal on line 34. In response, sequence logic module 20 will accept data on bus 24 from A/D converter 10 and flip-flop 16 will reset to drop the signal on line "H" "low".

Referring now to FIG. 3 where similar elements are similarly numbered to that of FIG. 1, it will be seen that the basic difference between this Figure and that of FIG. 1 resides in its simplicity and the deletion of the means for preventing the start of the conversion process during the presence of noise. This embodiment is highly desirable in those instances where the conversion periods are of a short duration with respect to overall sequencing cycle time. Thus, the request pulse, which is also the start pulse, is applied directly to A/D converter 10 causing the output thereof, appearing on line 34 to go "low" indicating the start of a conversion cycle. If no noisy pulses "F" appear on line 38, flip-flop 40 is not set and the reread signal on line 26, connected to sequence logic module 20, will remain "low" indicating valid data. If, however, at any time that the A/D output on line 34 and input "S" of gate 42 is "low" and concurrently a noisy signal appears at the "K" input to gate 42, output terminal "L" goes "high" and flip-flop 40 is immediately set causing the output at the "Q" terminal (line 26) to go "high" indicating to the sequence logic module 20 that any data appearing on bus 24 is invalid.

Referring now to FIG. 4 wherein similar elements are similarly numbered, it will be seen that the request pulse apearing on line 28 will initiate a start pulse on line 30 only if input "N" of gate 12 is "low". This starts the A/D conversion process of A/D converter 10 and in the absence of any noise, the data appearing on bus 24 will be accepted by sequence logic module 20 as valid. However, should noise occur during the time that a request pulse appears on line 28, gate 12 will be inhibited due to the high signal at input "N", and the signal on line 30 will be "low", and the A/D converter 10 will not supply data to bus 24. Should noise occur after the initiation of both the request pulse and the start pulse appearing on lines 28 and 30, respectively, and after the A/D conversion process has started, since line 34 is now "low", any "high" signal, as represented by the noise pulse is applied to input "Y" of gate 42 resulting in a "high" output applied to flip-flop 40 causing it to be set. Thus, a "high" signal appears at the "Q" output of flip-flop 47 and is applied, via line 26, to sequence logic module 20 indicating the data on bus 24 may be invalid and should be disregarded because of the noise pulse. In a successful conversion, the A/D request pulse on 28 will clock flip-flop 47 to its reset state, since the noise indication F appearing at its data data input, D will be low, i.e., absent. Further, during the conversion process flip-flop 47 will remain reset because no "high" signal at input "Y" of gate 42 occurs. Thus, when conversion ends and data ready, 34, goes "high", the re-read signal 26 will remain "low" until the next A/D request.

While there has been described what is presently considered the preferred embodiments of the invention, it should now be obvious to those skilled in the art from the foregoing teaching that various changes and modifications may be made therein without departing from the inventive concept contained herein, and it is, therefore, aimed to cover all such other changes and modifications that may fall within the true spirit and scope of the invention.

What is claimed is:

1. A plurality of signal sampling circuits operating in the presence of high noise levels, comprising:
   an equal plurality of converter means, each having a first signal, representative of a given parameter, applied as one input thereto and operating to provide a second signal representative of the one input signal as an output therefrom;
   an equal plurality of utilization means, each connected to a respective second signal converter output to regulate and vary a control signal;
   means detecting the noise generated by the regulation and variation of the control signals; and
   feedback means connected to the converter means and the utilization means to indicate when noise is coincident with the operation of the converter.

2. An electrical system having a plurality of switching devices operating in the presence of high noise levels, the switching of which are controlled by respective digital control signals, comprising:
   a sampling circuit having an input circuit connected to a line to which analog information to be sampled is applied and to which noise pulses, attributable to the switching of said switching devices, is undesirably apt to be coupled and having an output circuit;
   sequence logic for initiating requests for samples from the output circuit of said sampling circuit at regularly recurring sampling intervals and for thereafter passing on certain of said samples as a control signal, to ones of said plurality of switching devices;
   a noise detector for detecting the occurrence of the noise pulses to provide a noise signal; and
   feedback circuitry responsive to the occurrence of said noise signal during any one of said sampling intervals, to generate a corresponding re-read pulse for application to said sequence logic;
   said sequence logic being of a type responsive to the conclusion of each sampling interval to pass on the sample obtained during said sampling interval except when a re-read pulse is thereto applied, and further responsive to said re-read pulses, to repeat its request for a sample, before the next regularly recurring sampling interval.

3. An electrical system as set forth in claim 2 further comprising:
   a first flip-flop of the non-clocked set-reset type connected to the output of the sampling circuit, the first flip-flop reset at the conclusion of each sampling interval;
   a second flip-flop of the clocked, set-reset type having a data input terminal connected to the output of said first flip-flop and having said noise signal applied thereto as a clock signal, and having its output signal applied to said sequence logic to provide said re-read pulses;
   a first gate responsive to each request from said sequence logic made in the absence of said noise signal for initiating the sampling cycle of said sampling circuit, for setting said first flip-flop and for resetting said second flip-flop; and a second gate responsive to each request from said sequence logic made in the presence of said noise signal to set said second flip-flop.

4. An electrical system as set forth in claim 2 further comprising:

a non-clocked set-reset type flip-flop connected to be reset by each request from said sequence logic applied to said sampling circuit to initiate its sampling intervals and having its output connected to said sequence logic as a source of re-read pulses thereto; and a gate responsive only to the presence of both said noise signal and said conclusion of each sampling interval to supply a set signal to said flip-flop.

5. An electrical system as set forth in claim 2 further comprising:

a clocked, settable flip-flop having a data input terminal to which said noise signal is applied and having a clock signal input terminal connected to respond to each request from said sequence logic, and having its output signal applied to said sequence logic as a source of re-read pulses;

a first gate responsive to each request from said sequence logic made in the absence of said noise signal, for initiating the sampling cycle of said sampling circuit; and a second gate responsive to the presence of both said noise signal and the conclusion of each sampling interval to supply a set signal to said flip-flop.

6. In an electrical system operating in the presence of high electrical noise levels having a parameter to be sensed to derive a control signal indicative of the instantaneous condition of the parameters, the combination, comprising:

converter means for performing an A/D conversion, having first and second inputs and outputs;

means applying an analog signal, representative of the sensed parameter, to the first converter means input, the converter means having a digital signal representative of the sensed parameter, at the first output thereof, the converter means second output having a signal thereat at the conclusion of the A/D conversion;

logic means having a control signal input and first and second inputs and outputs, the first output connected to the converter means second input for periodically initiating the A/D conversion of the analog signal, the first input connected to the converter means first output for accepting the digital data in the absence of noise, the second input connected to the converter means second output for indicating the conclusion of the A/D conversion;

a noise detector for detecting the occurrence of a periodic electrical noise and providing a noise signal in response thereto;

means applying the noise signal to the control signal input of the logic means to indicate the presence of noise before the conclusion of the A/D conversion; and utilization means connected to the logic means second output, the logic means only passing those digital signals to the utilization means that occurred in the absence of noise during the A/D conversion.

7. The electrical system of claim 6 further comprising:

a first gate having a pair of inputs and an output, one input connected to the logic means first output, the other input connected to the noise detector and the output connected to the converter means second input to initiate the A/D conversion only during both the absence of a noise pulse and the presence of a pulse at the logic means first output;

a second gate having a pair of inputs and an output, one input connected to the logic means first output, the other input connected to the noise detector to provide a signal at the output only during the presence of a noise pulse and the presence of a pulse at the logic means first output;

a non-clocked, set-reset flip-flop set by the output of the first gate at the initiation of the A/D conversion and reset by the second output of the converter means at the conclusion of the A/D conversion to provide a data output signal at the conclusion of an A/D conversion; and a clocked, set-reset flip-flop having the data output signal of the non-clocked flip-flop applied as an input thereto, and set by the second gate output and reset by the first gate output, a clock input connected to the noise detector and an output connected to the logic means control signal input to indicate the presence of noise during the A/D conversion.

8. The electrical system of claim 6 further comprising:

a gate having a pair of inputs and an output, one input connected to the second output of the converter means, the other input connected to the noise detector to produce an output therefrom only after both the conclusion of the A/D conversion and presence of a noise pulse; and a non-clocked, set-reset type flip-flop set by the output of the gate and reset by the logic means first output to provide a data output signal therefrom, connected to the logic means control signal input, to indicate the presence of noise during the A/D conversion.

9. The electrical system of claim 6 further comprising:

a first gate having a pair of inputs and an output, one input connected to the logic means first output, the other input connected to the noise detector and the output connected to the converter means second input to initiate the A/D conversion only during both the absence of a noise pulse and the presence of a pulse at the logic means first output;

a second gate having a pair of inputs and an output, one input connected to the second output of the converter means, the other input connected to the noise detector to produce an output therefrom only after both the conclusion of the A/D conversion and the presence of a noise pulse; and a clocked, set-reset flip-flop set by the second gate output, a clock input connected to the logic means first output and a data input connected to the noise pulses to provide a control signal output therefrom, connected to the logic means control signal input, to indicate the presence of noise after the initiation of the A/D conversion and before the conclusion thereof.

* * * * *